(12) United States Patent
Liu et al.

(10) Patent No.: US 10,249,763 B2
(45) Date of Patent: Apr. 2, 2019

(54) ARRAY SUBSTRATE, AND DISPLAY DEVICE, AND FABRICATION METHODS

(71) Applicant: BOE TECHNOLOGY GROUP CO., LTD., Beijing (CN)

(72) Inventors: Zheng Liu, Beijing (CN); Xiaolong Li, Beijing (CN); Yueping Zuo, Beijing (CN); Lujiang Huangfu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 2 days.

(21) Appl. No.: 15/528,215

(22) PCT Filed: Dec. 12, 2016

(86) PCT No.: PCT/CN2016/109460
§ 371 (c)(1),
(2) Date: May 19, 2017

(87) PCT Pub. No.: WO2017/181698
PCT Pub. Date: Oct. 26, 2017

(65) Prior Publication Data
US 2018/0197996 A1  Jul. 12, 2018

(30) Foreign Application Priority Data

Apr. 18, 2016 (CN) .......................... 2016 1 0239440

(51) Int. Cl.
*H01L 29/786* (2006.01)
*H01L 29/66* (2006.01)

(52) U.S. Cl.
CPC .. *H01L 29/78642* (2013.01); *H01L 29/66757* (2013.01); *H01L 29/78645* (2013.01); *H01L 29/78675* (2013.01); *H01L 29/78696* (2013.01)

(58) Field of Classification Search
CPC ............. H01L 29/7869; H01L 27/1225; H01L 29/78648; H01L 29/78696; H01L 27/124; G02F 1/1368
(Continued)

(56) References Cited

U.S. PATENT DOCUMENTS

| 2009/0045404 | A1 | 2/2009 | Sakai |
| 2012/0115289 | A1 | 5/2012 | Scheuerlein |

(Continued)

FOREIGN PATENT DOCUMENTS

| CN | 101228619 A | 7/2008 |
| CN | 103824780 A | 5/2014 |

(Continued)

OTHER PUBLICATIONS

The World Intellectual Property Organization (WIPO) International Search Report and Written Opinion for PCT/CN2016/109460 dated Mar. 8, 2017; 12 pages.

*Primary Examiner* — Jonathan Han
(74) *Attorney, Agent, or Firm* — Anova Law Group, PLLC (57) ABSTRACT

A semiconductor device, an array substrate, and a display device, and their fabrication methods are provided. An exemplary semiconductor device includes a first electrode, an insulating layer, and a second electrode, over a substrate. A conductive layer is on the insulating layer. A semiconductor layer is on the first electrode, on a first sidewall of the insulating layer, on the conductive layer, on the second sidewall of the insulating layer, and on the second electrode. A first gate electrode is over a portion of the semiconductor layer that is on the first sidewall of the insulating layer. A second gate electrode is over a portion of the semiconductor layer that is on the second sidewall of the insulating layer.

20 Claims, 4 Drawing Sheets

(58) Field of Classification Search
USPC ............... 257/42, 43, 59, E27.111, E29.275; 349/43, 438, 157, 176, 283; 438/157, 438/176, 283
See application file for complete search history.

(56) References Cited

U.S. PATENT DOCUMENTS

| | | | |
|---|---|---|---|
| 2014/0103346 A1* | 4/2014 | Yamazaki | ........... H01L 29/7869 257/57 |
| 2014/0132875 A1* | 5/2014 | Yun | ................... H01L 29/66742 349/46 |
| 2016/0380114 A1 | 12/2016 | Kong et al. | |

FOREIGN PATENT DOCUMENTS

| | | |
|---|---|---|
| CN | 105097895 A | 11/2015 |
| CN | 105870195 A | 8/2016 |

* cited by examiner

FIG. 8

ARRAY SUBSTRATE, AND DISPLAY DEVICE, AND FABRICATION METHODS

CROSS-REFERENCE TO RELATED APPLICATION

This application is a national phase entry under 35 U.S.C. § 371 of PCT patent application No. PCT/CN2016/109460, filed on Dec. 12, 2016, which claims priority of Chinese Patent Application No. 201610239440.1, filed Apr. 18, 2016, the entire contents of both of which are incorporated herein by reference.

TECHNICAL FIELD

The present disclosure generally relates to display technology, more particularly, relates to a thin film transistor (TFT), an array substrate containing the semiconductor device, a display device containing the semiconductor device, and a method for forming the TFT.

BACKGROUND

Thin film transistors (TFTs) have low power consumption, small sizes, and mature fabrication technology, and are widely used in display devices. A TFT having a great channel length often provides a higher turn-on current, and the TFT often has better performance. The channel length of a TFT refers to the length of the channel between the source electrode and the drain electrode.

For a display device with high resolution, TFTs with small sizes are desired. Accordingly, requirements on the fabrication, the electrical properties, and the reliability of the TFT array substrate are more demanding. Particularly, in organic light-emitting diode (OLED) display technology, a driving TFT often requires a considerably long channel. As a result, more chip area is required for forming the TFT, which limits the high resolution design of the TFT array substrate.

SUMMARY

One aspect of the present disclosure provides a semiconductor device. The semiconductor device includes a first electrode, an insulating layer, and a second electrode, over a substrate; a conductive layer on the insulating layer; a semiconductor layer: on the first electrode, on a first sidewall of the insulating layer, on the conductive layer, on the second sidewall of the insulating layer, and on the second electrode; a first gate electrode over a portion of the semiconductor layer that is on the first sidewall of the insulating layer; and a second gate electrode over a portion of the semiconductor layer that is on the second sidewall of the insulating layer.

Optionally, the semiconductor layer has a length connecting the first and second electrodes, and the length of the semiconductor layer is greater than a straight distance between the first and second electrodes.

Optionally, the semiconductor layer has one or more of a protruding shape and a trench shape.

Optionally, the insulating layer is between the first and second electrodes, wherein the first and second electrodes are both on the substrate, and the insulating layer is further extended on a surface portion of each of the first and second electrodes, and has the first sidewall on the first electrode, and the second sidewall on the second electrode.

Optionally, the conductive layer is on a surface of the insulating layer that has a trench formed into the insulating layer, and a portion of the conductive layer is in the trench of the insulating layer.

Optionally, an orthogonal projection of the conductive layer on the substrate at least partially overlaps with orthogonal projections of the first electrode and the second electrode on the substrate.

Optionally, the insulating layer is on the substrate, the first and second electrodes are on the insulating layer, the insulating layer has a trench structure between the first and second electrodes, the first sidewall of the insulating layer is a first trench sidewall in the insulating layer, the second sidewall of the insulating layer is a second trench sidewall in the insulating layer, and the conductive layer is in the insulating layer and under a bottom of the trench structure in the insulating layer.

Optionally, a portion of the semiconductor layer is in the trench of the insulating layer.

Optionally, an area of an orthogonal projection of the conductive layer on the substrate is smaller than an area of an orthogonal projection of a portion of the semiconductor layer that is substantially parallel with a surface plane of the substrate.

Optionally, a gate insulating layer between the semiconductor layer and the gate electrodes.

Optionally, the conductive layer is made of one or more of doped amorphous silicon and doped polysilicon.

Another aspect of the present disclosure provides an array substrate including one or more disclosed semiconductor devices.

Another aspect of the present disclosure provides a display device including the disclosed array substrate.

Another aspect of the present disclosure provides a method for forming a semiconductor device by forming a first electrode, an insulating layer, and a second electrode, over a substrate; forming a conductive layer on the insulating layer; forming a semiconductor layer: on the first electrode, on a first sidewall of the insulating layer, on the conductive layer, on the second sidewall of the insulating layer, and on the second electrode; forming a first gate electrode over a portion of the semiconductor layer that is on the first sidewall of the insulating layer; and forming a second gate electrode over a portion of the semiconductor layer that is on the second sidewall of the insulating layer.

Optionally, the semiconductor layer has a length connecting the first and second electrodes, and the length of the semiconductor layer is greater than a straight distance between the first and second electrodes.

Optionally, the semiconductor layer has one or more of a protruding shape and a trench shape.

Optionally, the insulating layer is formed between the first and second electrodes, wherein the first and second electrodes are both on the substrate, and the insulating layer is further extended on a surface portion of each of the first and second electrodes, and has the first sidewall on the first electrode, and the second sidewall on the second electrode.

Optionally, the conductive layer is on a surface of the insulating layer that has a trench formed into the insulating layer, and a portion of the conductive layer is disposed in the trench of the insulating layer.

Optionally, the insulating layer is on the substrate, the first and second electrodes are on the insulating layer, the insulating layer has a trench structure between the first and second electrodes, the first sidewall of the insulating layer is a first trench sidewall in the insulating layer, the second sidewall of the insulating layer is a second trench sidewall in the insulating layer, and the conductive layer is in the insulating layer and under a bottom of the trench structure in the insulating layer.

Optionally, a portion of the semiconductor layer is in the trench of the insulating layer.

BRIEF DESCRIPTION OF THE FIGURES

The following drawings are merely examples for illustrative purposes according to various disclosed embodiments and are not intended to limit the scope of the present disclosure.

DETAILED DESCRIPTION

The disclosure will now describe more specifically with reference to the following embodiments. It is to be noted that the following descriptions of some embodiments are presented herein for purpose of illustration and description only. It is not intended to be exhaustive or to be limited to the precise form disclosed.

The present disclosure provides a semiconductor device, an array substrate containing the semiconductor device, a display device containing the semiconductor device, and their fabrication methods.

Figure 1:
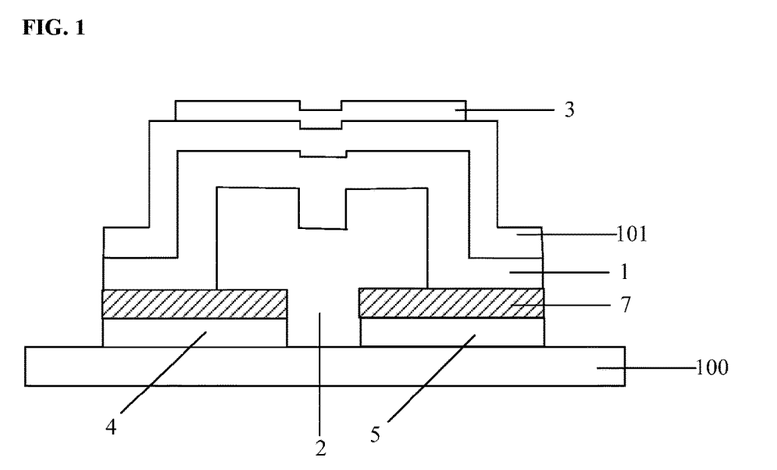
FIG. 1 illustrates a cross-sectional view of an exemplary semiconductor device according to the disclosed embodiments of the present disclosure.
Figure 2:
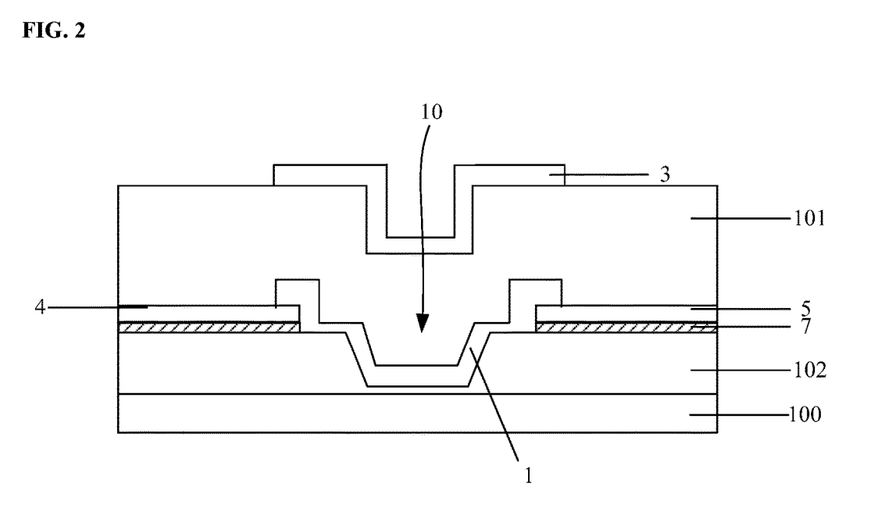
FIG. 2 illustrates a cross-sectional view of another exemplary semiconductor device according to the disclosed embodiments of the present disclosure.

In one embodiment, the semiconductor device includes any suitable device including, for example, a transistor such as a TFT. As shown in FIGS. 1 and 2, the disclosed TFT may include a semiconductor layer 1, gate electrodes 3, a source electrode 4, and a drain electrode 5, formed over a substrate 100. When the exemplary TFT is turned on, a conductive channel may be formed in the portion of the semiconductor layer 1 between the source electrode 4 and the drain electrode 5. The length of the conductive channel may be the length of the portion of the semiconductor layer 1, extending from the source electrode 4 to the drain electrode 5. The source electrode 4 may also be referred as a first electrode, and the drain electrode may also be referred as a second electrode.

The semiconductor layer 1 may include a first portion and a second portion. The first portion may be located in a plane intersecting or perpendicularly intersecting with the plane of a top surface, or a surface plane, of the substrate 100. In the present disclosure, two intersecting planes may refer to two non-parallel planes. The second portion may be located in a plane at least substantially parallel with the plane of the top surface of the substrate 100.

Accordingly, the semiconductor layer 1 may have a first length in the directions perpendicular to and a second length at least substantially parallel with the substrate 100. Thus, at a same orthogonal projection area on the substrate 100, the disclosed semiconductor layer 1 may have an increased length than the straight distance from the source electrode 4 and the drain electrode 5. A channel with a greater length may be provided, and the performance of the TFT may be improved accordingly. A TFT with a smaller size may be formed and the performance of the TFT may be ensured. The disclosed TFT may be used in products with high resolution.

When the disclosed TFT is used in display devices, the substrate 100 may be used as the substrate or base for the TFT array substrate. The substrate 100 may be optically transparent. For example, the substrate 100 may be a glass substrate, a quartz substrate, and/or an organic resin substrate.

The disclosed semiconductor layer 1 may have, e.g., a protruding shape, a trench shape, or a combination of a protruding shape and a trench shape. The disclosed semiconductor layer 1 may also have other suitable shapes. It is desired that the length of the semiconductor layer 1 being greater than the straight distance between the source electrode 4 and the drain electrode 5. In various embodiments, the semiconductor layer 1 may have other suitable non-flat shapes or non-flat structures, e.g., including irregular shapes.

The formation of the semiconductor layer 1 may now be illustrated in connection of a protruding structure and a trench structure, for example, as shown in FIGS. 1-4. In some embodiments, the semiconductor layer 1 may be formed over the protruding structure to have a protruding shape. In some other embodiments, the semiconductor layer 1 may be formed over the trench structure to have a trench shape.

In one embodiment, a protruding structure may be formed to realize the shape of the semiconductor layer 1. As shown in FIG. 1, an insulating layer 2 may be formed on the substrate 100. The top surfaces of the insulating layer 2, positioned away from the substrate 100, may be at least substantially parallel with the plane the substrate 100 is located in. The insulating layer 2 may also include side surfaces intersecting or perpendicularly intersecting with the top surfaces of the insulating layer 2. The first portion of the semiconductor layer 1 may be at least partially formed on the side surfaces of the insulating layer 2. The second portion of the semiconductor layer 1 may be formed on the top surfaces of the insulating layer 2. In one embodiment, the first portion of the semiconductor layer 1 may cover the side surfaces of the insulating layer, and the second portion of the semiconductor layer 1 may cover the top surfaces of the insulating layer 2. The top surfaces of the insulating layer 2 may be higher than the top surfaces of the source electrode 4 and the drain electrode 5 such that the insulating layer 2 may protrude beyond the source electrode 4 and the drain electrode 5. Because the insulating layer 2 has a certain thickness, the semiconductor layer 1 may be extended along directions at least substantially parallel with and perpendicular to the substrate 100. For the same orthogonal projection area, on the substrate 100, the semiconductor layer 1 with the disclosed protruding shape may have an increased length than a conventional semiconductor layer, e.g., with a flat structure. The length of the semiconductor layer 1 may be greater than the straight distance between the source electrode 4 and the drain electrode 5. Thus, the conductive channel may have an increased length. The TFT may have improved performance. A smaller TFT may be formed and the performance of the TFT may be ensured. The disclosed TFT may be suitable for products with high resolution.

In some embodiments, the first portion of the semiconductor layer 1 may cover the side surfaces of the insulating layer 2, and the second portion of the semiconductor layer 1 may cover the top surfaces of the insulating layer 2. That is, the semiconductor layer 1 may fully cover the insulating layer 2. Thus, the portions of the semiconductor layer 1 formed on the two side surfaces of the insulating layer 2 may be uniformly extended along a direction that is perpendicular to the substrate 100. The length of the semiconductor layer 1 may be more effectively increased. Further, the semiconductor layer 1 may further include a third portion formed on the two ends of the semiconductor layer 1. The third portion may include a first region and a second region. The first region and the second region may each electrically contact a different one of the source electrode 4 and the drain electrode 5 of the TFT.

To decrease the contact resistance between the source electrode 4 and the semiconductor layer 1, and between the drain electrode 5 and the semiconductor layer 1, optionally an ohmic contact layer 7 may be formed between the source electrode 4 and the semiconductor layer 1 and between the drain electrode 5 and the semiconductor layer 1. The ohmic contact layer 7 may be one or more of a doped amorphous silicon layer and a doped polysilicon layer. In various embodiments of the present disclosure, the ohmic contact layer 7 may be used to enhance the adhesion between the source electrode 4/drain electrode 5 bonded to the ohmic contact layer 7 and the other layer bonded/adhered to the ohmic contact layer 7. The ohmic contact layer 7 may be optional. The source electrode 4 and the drain electrode 5 may be interchangeable.

When the source electrode 4 and the drain electrode 5 are located below the semiconductor layer 1, one end of the insulating layer 2 may be connected to the source electrode 4, and the other end or the opposite end of the insulating layer 2 may be connected to the drain electrode 5, to reduce the distance between the source electrode 4 and the drain electrode 5 and to further reduce the size of the formed TFT. It should be noted that, one end of the insulating layer 2 being connected to the source electrode 4 (or the drain electrode 5) refers to that, the insulating layer 2 contacts the source electrode 4 (or the drain electrode 5), and only a portion of the source electrode 4 (or a portion of the drain electrode 5) contacts a portion of the insulating layer 2.

At a certain orthogonal projection area, by forming the insulating layer 2, the length of the portion of the semiconductor layer 1 perpendicular to the substrate 100 may be increased to increase the total length of the semiconductor layer 1. Thus, to effectively increase the length of the semiconductor layer 1, it may be ensured that the insulating layer 2 is sufficiently thick for a desired length of the semiconductor layer 1 to be formed.

In some embodiments, the insulating layer 2 may be made of a suitable inorganic material, e.g., silicon nitride, silicon oxide, and/or silicon oxynitride. The insulating layer 2 may have a single-layered structure or a multiple-layered structure. The thickness of the insulating layer 2 may be in the range of about 2000 Å to about 8000 Å. In some other embodiments, the insulating layer 2 may be formed through a suitable deposition process such as plasma enhanced chemical vapor deposition (PECVD), low-pressure chemical vapor deposition (LPCVD), atmosphere-pressure chemical vapor deposition (APCVD), and/or electron-cyclotron-resonance chemical vapor deposition (ECR-CVD). The insulating layer 2 may also be made of a suitable organic material, e.g., organic resin, acrylic, and/or polyimide. The insulating layer 2 may have a single-layered structure or a multiple-layered structure. The thickness of the insulating layer 2 may be in the range of about 10000 Å to about 20000 Å. In some other embodiments, the insulating layer 2 may also include a combination of at least one layer of inorganic material and at least one layer of organic material. The thicknesses described above are merely exemplary thicknesses. The specific thickness of the insulating layer 2 may be determined according to different applications and/or designs and should not be limited by the embodiments of the present disclosure.

In practice, to prevent film cracking in subsequent fabrication steps, the edges of the insulating layer 2 may have sloped angles.

In another embodiment, a trench structure may be formed to realize the structure of the semiconductor layer 1. As shown in FIG. 2, a trench structure 10 may be formed on the substrate 100. The plane the trench bottom of the trench structure 10 is located in may be at least substantially parallel with the plane the substrate 100 is located in. The trench sidewalls of the trench structure 10 may be located in the planes that are intersecting with the plane the substrate 100 is located in. At least a portion of the first portion of the semiconductor layer 1 may be disposed on the trench sidewalls. The second portion of the semiconductor layer 1 may be disposed on the trench bottom of the trench structure 10. In one embodiment, the first portion of the semiconductor layer 1 may cover the trench sidewalls, and the second portion of the semiconductor layer 1 may cover the trench bottom. The first portion of the semiconductor layer 1 may be connected with the source electrode 4 and the drain electrode 5 such that when a turn-on voltage is applied on the gate electrode 3, a conductive channel may be formed in the semiconductor layer 1 to connect the source electrode 4 and the drain electrode 5.

Because the trench structure may have a certain depth, the semiconductor layer 1 may be extended along the directions at least substantially parallel with the substrate 100 and perpendicular to the substrate 100. Thus, at a same orthogonal projection area, the length of the semiconductor layer 1, having the disclosed structure, may be increased compared to a conventional semiconductor layer, e.g., having a flat structure. The conductive channel formed in the semiconductor layer 1 may have an increased channel length compared to a conventional device. The performance of the TFT may be improved. The formed TFT may have a reduced size. The performance of the TFT may be ensured, and the TFT may be suitable for products having high resolution.

Figure 4:
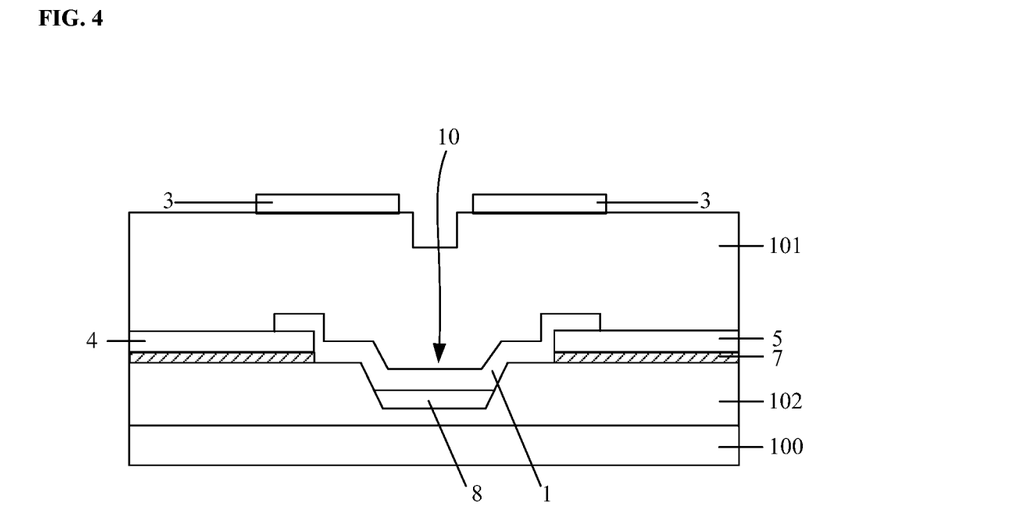
FIG. 4 illustrates a cross-sectional view of another exemplary semiconductor device according to the disclosed embodiments of the present disclosure.

Specifically, a transition layer 102, such as an insulating layer, may be formed on the substrate 100, and the trench structure 10 may be formed in the transition layer 102. The transition layer 102 may be sufficiently thick such that the trench structure 10 may have a sufficiently large depth. The trench bottom of the trench structure 10 may be lower than the surfaces of the source electrode 4 and the drain electrode 5. The trench structure 10 may be formed between the electrodes 4 and 5. As shown in FIG. 4, the doped layer 8 may be in the transition layer 102, such as an insulating layer, and under a bottom of the trench structure 10.

In some embodiments, the transition layer 102 may be formed from a suitable inorganic material, e.g., silicon nitride, silicon oxide, and/or silicon oxynitride. The transition layer 102 may have a single-layered structure or a multiple-layered structure. The thickness of the transition layer 102 may be in the range of about 2000 Å to about 8000 Å. The transition layer 102 may be formed through a suitable deposition process such as PECVD, LPCVD, APCVD, and/or ECR-CVD. In some other embodiments, the transition layer 102 may also be formed from a suitable organic material, such as organic resin, acrylic, and/or polyimide. The transition layer 102 may have a single-layered structure or a multiple-layered structure. The thickness of the transition layer 102 may be in the range of about 10000 Å to about 20000 Å. In some other embodiments, the transition layer 102 may also include a combination of at least one inorganic and at least one organic layer. The thicknesses described above are merely suggested or exemplary thicknesses. The specific thickness of the transition layer 102 may be determined according to different applications and/or designs and should not be limited by the embodiments of the present disclosure.

In some embodiments, the trench structure 10 may be formed directly on the substrate 100.

The specific processes to form a trench structure 10 may vary according to different applications and/or designs, and should not be limited by the embodiments of the present disclosure. For example, two protruding structures may be formed on the substrate 100 to form a semiconductor layer 1 having a trench shape between the two protruding structures.

In the embodiments described above, a protruding structure and a trench structure may be formed to form the structure or shape of the disclosed semiconductor layer 1. In certain embodiments, the protruding structure and the trench structure may also be combined to form a desired structure or shape of the semiconductor layer 1. In certain other embodiments, other suitable methods or processes may also be used to form the semiconductor layer 1 with an increased length and a conductive channel with increased channel length. The specific processes to form the semiconductor layer 1 should not be limited by the embodiments of the present disclosure.

Referring to FIG. 1, a top-gated TFT may be described as an example to illustrate the disclosed TFT.

The TFT may include a source electrode 4 and a drain electrode 5 formed on the substrate 100. The source electrode 4 and the drain electrode 5 may be formed from a same source-drain conductive layer and through a same patterning process. In one embodiment, the substrate 100 may be transparent. In one embodiment, the source-drain conductive layer may be made of a suitable metal material, e.g., copper.

The TFT may include an insulating layer 2 formed on the source electrode 4 and the drain electrode 5. One end of the insulating layer 2 may be connected with the source electrode 4, and the other end of the insulating layer 2 may be connected with the drain electrode 5. The top surfaces of the insulating layer 2 positioned away from the substrate 100 may be at least substantially parallel with the plane the substrate 100 is located in. The insulating layer 2 may also include side surfaces intersecting with the top surfaces positioned away from the substrate 100.

The semiconductor layer 1, formed over the insulating layer 2, may include a first portion, a second portion, and a third portion. The first portion of the semiconductor layer 1 may cover the side surfaces of the insulating layer 2. The second portion of the semiconductor layer 1 may cover top the top surfaces of the insulating layer 2 that are positioned away from the substrate 100. The third portion of the semiconductor layer 1 may include a first region and a second region. The first region may be positioned at one end of the semiconductor layer 1 and the second region may be positioned at the other end of the semiconductor layer 1. The first region and the second region may each electrically contact a different one of the source electrode 4 and the drain electrode 5.

Optionally, the TFT may include an ohmic contact layer 7 between the semiconductor layer 1 and the source electrode 4/drain electrode 5. The ohmic contact layer 7 may be a doped polysilicon layer.

The TFT may further include a gate insulating layer 101 covering the semiconductor layer 1. The gate insulating layer 101 may be made of a suitable material such as silicon oxide and/or silicon nitride. The gate insulating layer 101 may have a single-layered structure of a multiple-layered structure.

The TFT may further include gate electrodes 3 formed over the gate insulating layer 101. In one embodiment, the number of gate electrodes 3 may be at least one.

When a trench structure 10 is formed to form the disclosed structure of the semiconductor layer 1, the structure of the TFT may be depicted in FIG. 2. The labeling of parts in FIG. 2 may be similar or same as the labeling in FIG. 1, and is not repeated herein.

FIGS. 1 and 2 only illustrate structures of top-gated TFTs. However, the disclosed technical solution is suitable not only for top-gated TFTs and also suitable for other types of TFTs, such as bottom-gated TFTs and coplanar TFTs.

Embodiments of the present disclosure further provide a method for fabricating the disclosed TFT. The method may include fabrication steps to form the semiconductor layer on a substrate. The fabrication steps to form the semiconductor layer may include the follows.

First, the first portion of the semiconductor layer may be formed. The plane the first portion is located in may be intersecting with the plane the substrate is located in.

Further, the second portion of the semiconductor layer may be formed. The plane the second portion is located in may be at least substantially parallel with the plane the substrate is located in.

By performing the above steps, the semiconductor layer of the TFT may be extended along directions perpendicular to and at least substantially parallel with the substrate. Thus, with a same orthogonal projection area, the semiconductor layer having the disclosed structure may have an increased length compared to a conventional semiconductor structure that has a flat structure. The conductive channel formed in the disclosed semiconductor layer may have an increased channel length. The performance of the TFT may be improved and the size of the TFT may be decreased. The performance of the TFT may be ensured. The TFT may be suitable for products with high resolution.

In another embodiment, the method to fabricate the TFT may further include the following steps.

An insulating layer may be formed. The insulating layer may provide electrical insulation. The top surfaces of the insulating layer positioned away from the substrate may be at least substantially parallel with the plane the substrate is located in. The insulating layer may also include side surfaces being intersecting with the top surfaces of the insulating layer.

At least a portion of the first portion of the semiconductor layer may be formed on the side surfaces of the insulating layer. The second portion of the semiconductor layer may be formed on the top surfaces of the insulating layer.

In the embodiments described above, the insulating layer may have a protruding structure such that the semiconductor layer formed over the insulating layer may be extended along the directions at least substantially parallel with and perpendicular to the substrate. At a same orthogonal projection area, the conductive channel formed in the disclosed semiconductor layer may have an increased channel length compared with a conventional semiconductor layer.

In another embodiment, the method to fabricate the TFT may further include the following steps.

A trench structure may be formed. The trench structure may be made of an electrically insulating material. The trench bottom of the trench structure may be located in a plane that is at least substantially parallel with the plane the substrate is located in. The trench sidewalls may be located in planes that are intersecting with the plane the substrate is located in.

At least a portion of the first portion of the semiconductor layer may be formed over the trench sidewalls. The second portion of the semiconductor layer may be formed over the trench bottom.

In the embodiments described above, the semiconductor layer may be formed over the trench structure such that the semiconductor layer may be extended along the directions at least substantially parallel with and perpendicular to the substrate. At a same orthogonal projection area, the conductive channel may have an increased channel length compared to a conventional semiconductor layer.

Figure 3:
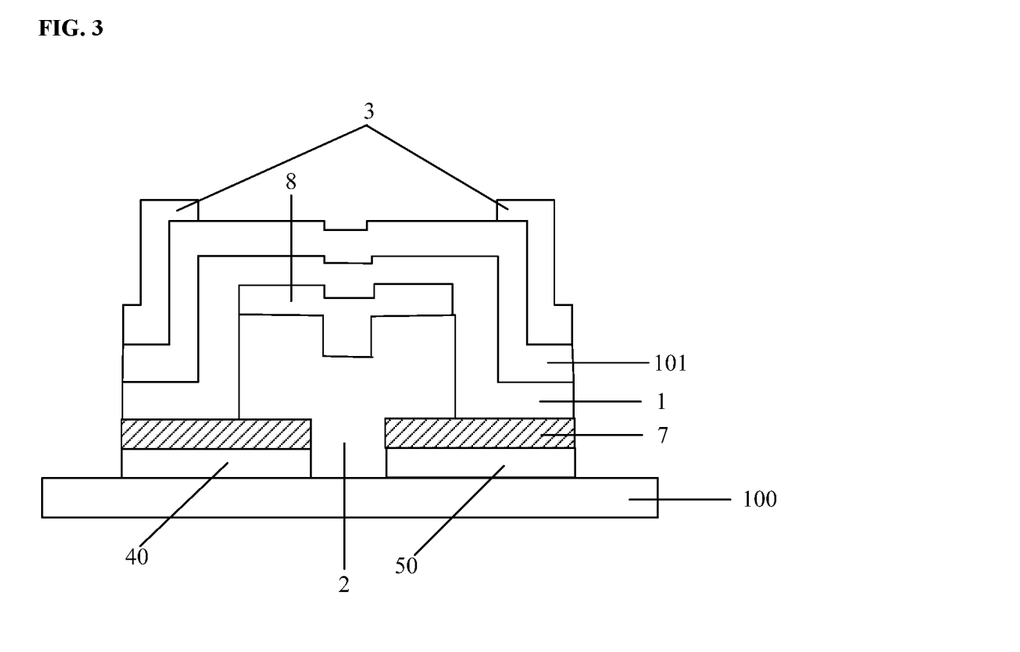
FIG. 3 illustrates a cross-sectional view of another exemplary semiconductor device according to the disclosed embodiments of the present disclosure.

Embodiments of the present disclosure provide a semiconductor device based on the disclosed semiconductor layer. The semiconductor device may further include a conductive layer, for example, a doped layer 8, as shown in FIGS. 3 and 4. Although the doped layer 8 is used as an example for describing the conductive layer, any other suitable conductive layer(s) can be alternatively used or otherwise included in accordance with various embodiments of the present disclosure.

FIGS. 3 and 4 each illustrates an exemplary semiconductor device disclosed by the present disclosure. The semiconductor device may include a substrate 100, a semiconductor layer 1, a first electrode 40, a second electrode 50, a doped layer 8, and two gate electrodes 3. An insulating layer may be formed between the gate electrodes 3 and the first electrode 40/second electrode 50, between the first electrode 40 and the second electrode 50, and between the semiconductor layer 1 and the first electrode 40/second electrode 50. One end of the semiconductor layer 1 may have electrical contact with the first electrode 40, and the other end or the opposite end of the semiconductor layer 1 may have electrical contact with the second electrode 50. For the semiconductor device shown in FIG. 3, the doped layer 8 may be formed between the semiconductor layer 1 and the insulating layer 2. For the semiconductor device shown in FIG. 4, the doped layer 8 may be formed in the trench between the semiconductor layer 1 and the transition layer 102.

As shown in FIG. 3, the doped layer 8 may have one end connecting to the first electrode 40 via a portion of the semiconductor layer 1, and have another end connecting to the second electrode 50 via another portion of the semiconductor layer 1. In other words, a portion of the semiconductor layer 1 is formed on the first electrode 40, on a sidewall of the insulating layer 2, and on one end, including a sidewall and a surface portion, of the doped layer 8. Another portion of the semiconductor layer 1 is formed on the second electrode 50, on another sidewall of the insulating layer 2, and on another end, including a sidewall and a surface portion, of the doped layer 8.

Also as shown in FIG. 4, the doped layer 8 may have one end connecting to the first electrode 40 via a portion of the semiconductor layer 1, and have another end connecting to the second electrode 50 via another portion of the semiconductor layer 1. In other words, a portion of the semiconductor layer 1 is formed on the first electrode 40, on a trench sidewall of the insulating layer 2, and on a portion of the doped layer 8. Another portion of the semiconductor layer 1 is formed on the second electrode 50, on another trench sidewall of the insulating layer 2, and on another portion of the doped layer 8.

By forming two gate electrodes 3, the semiconductor device may function as two TFTs configured in series. When the two gate electrodes 3 are applied with a turn-on voltage, and the threshold voltage of the TFT may be adjustable. Each one of the two gate electrodes 3 may correspond to one TFT and one of the first electrode 40 and the second electrode 50. When the gate electrodes 3 are applied with the turn-on voltage, the doped layer 8 may connect the two TFTs in series. The performance of the semiconductor device may be improved.

Referring back to FIGS. 3 and 4, the semiconductor layer 1 may include a first portion and a second portion. The first portion may be located in a plane intersecting or perpendicularly intersecting with the plane of a top surface of the substrate 100. The second portion may be located a plane at least substantially parallel with the plane that the substrate 100 is located. Accordingly, the semiconductor layer 1 may be extended, in the directions perpendicular to and at least substantially parallel with, a top surface of the substrate 100. Thus, at a same orthogonal projection area on the substrate 100, the disclosed semiconductor layer 1 may have an increased length compared to a conventional semiconductor layer, e.g., having a flat structure. A conductive channel with a greater channel length may be provided, and the performance of the TFT may be improved accordingly. A TFT with smaller size may be formed and the performance of the TFT may be ensured. The disclosed TFT may be used in products with high resolution.

The semiconductor layer 1 may also include a third portion. The third portion may include a first region and a second region. The first region may electrically contact the first electrode 40. The second region may electrically contact the second electrode 5.

Optionally, as shown in FIG. 3, an ohmic contact layer 7 may be formed between the first electrode 40 and the semiconductor layer 1, and between the second electrode 50 and the semiconductor layer 1. The ohmic contact layer 7 may reduce the contact resistance between the first electrode 40 and the semiconductor layer 1, and between the second electrode 50 and the semiconductor layer 1. Optionally, as shown in FIG. 4, an ohmic contact layer 7 may be formed between the first electrode 40 and the transition layer 102, and between the second electrode 50 and the transition layer 102. The trench bottom of the trench structure 10 may be lower than the surfaces of the source electrode 4 and the drain electrode 5. The ohmic contact layer 7 may be made of a suitable layer, e.g., a doped amorphous silicon layer and/or a doped polysilicon layer.

When the semiconductor layer 1 is at least partially covering the first electrode 40 and the second electrode 50, as shown in FIG. 4, the first electrode 40 may be connected to one end of the semiconductor layer 1 and the second electrode 50 may be connected to the other end or the opposite end of the semiconductor layer 1, to reduce the distance between the first electrode 40 and the second electrode 50, increase the length of the semiconductor layer 1 between the first electrode 40 and the second electrode 50, and to further reduce the size of the semiconductor device. The first electrode 40 (or the second electrode 50) being connected to the semiconductor layer 1 refers to that the first electrode 40 (or the second electrode 50) contacts the semiconductor layer 1, and at least a portion of the semiconductor layer 1 contacts the first electrode 40 (or the second electrode 50).

To form a semiconductor layer 1 with the disclosed structures, the semiconductor layer 1 may have a protruding shape, a trench shape, or a combination of the protruding shape and the trench shape. The semiconductor layer 1 may also have other non-flat structures or shapes, e.g., irregular shapes. The specific shape of the semiconductor layer 1 should not be limited by the embodiments of the present disclosure.

The specific ways to form the semiconductor layer 1 with a protruding shape and/or a trench shape may be referred to the embodiments described above and are not repeated herein.

As shown in FIGS. 3 and 4, a doped layer 8, contacting the second portion of the semiconductor layer 1, may be disposed. The doped layer 8 may be positioned between the first electrode 40 and the second electrode 50. For the semiconductor device shown in FIG. 3, the doped layer 8 may be formed between the semiconductor layer 1 and the insulating layer 2. The insulating layer 2 may be formed over the semiconductor layer 1. For the semiconductor device shown in FIG. 4, the doped layer 8 may be formed in the trench, i.e., over the trench bottom, between the semiconductor layer 1 and the transition layer 102. The semiconductor layer 1 may cover the doped layer 8 and contact the first electrode 40 and the second electrode 50. When the semiconductor device is turned on, the voltage difference between the first electrode 40 and the doped layer 8 may drive the carriers in the semiconductor layer 1, between the first electrode 40 and the doped layer 8, to move. That is, the semiconductor device may function as two TFTs connected in series. Leakage current may be effectively reduced, and the semiconductor device may be more stable. Specifically, the doped layer 8 and the ohmic contact layer 7 may be made of a same material, e.g., doped amorphous silicon and/or doped polysilicon, to reduce cost. The ohmic contact layer 7 may be located between the first electrode 40 and the semiconductor layer 1 and between the second electrode 50 and the semiconductor layer 1, to improve or reduce the contact resistance between the first electrode 40 and the semiconductor layer 1 and the contact resistance between the second electrode 50 and the semiconductor layer 1.

Further, the orthogonal projection area, of the doped layer 8, on the substrate 100, may be smaller than the orthogonal projection area of the second portion of the semiconductor layer 1, on the substrate 100. Thus, the leakage current can be reduced and the doped layer 8 may have less impact on the length of the conductive channel at the same time. In some embodiments, the orthogonal projection of the doped layer 8, on the substrate 100, may at least partially overlap with the orthogonal projections of the first electrode 40 and the second electrode 50. Thus, the doped layer 8 may occupy less space, making it easier to form a semiconductor device, e.g., formed by two TFTs connected in series, with a desirably small size.

As shown in FIG. 3, when an insulating layer 2 is formed to realize the disclosed structure of the semiconductor layer 1, the doped layer 8 may be disposed on the top surfaces of the insulating layer 2, where the top surfaces are positioned away from the substrate 100. The top surfaces of the insulating layer 2 may be higher than the top surfaces of the first electrode 40 and the second electrode 50 such that the insulating layer 2 may protrude beyond the first electrode 40 and the second electrode 50. When the first electrode 40 and the second electrode 50 are positioned under the semiconductor layer 1, in some embodiments, one end of the insulating layer 2 may be connected to the first electrode 40, and the other end or the opposite end of the insulating layer 2 may be connected to the second electrode 50. The distance between the first electrode 40 and the second electrode 50 may be reduced, and the size of the semiconductor device may be further reduced. Further, the orthogonal projection area of the doped layer 8, on the substrate 100, may be smaller than the orthogonal projection area of the top surfaces of the insulating layer 2, on the substrate 100. Thus, the doped layer 2 may reduce the leakage current of the semiconductor device, and may have less impact on the channel length of the conductive channel.

As shown in FIG. 4, when a trench structure 10 is formed to realize the disclosed structure of the semiconductor layer 1, the doped layer 8 may be formed on the transition layer 102 and in contact with a bottom of the trench structure 10 of the semiconductor layer 1. The area of the orthogonal projection of the doped layer 8 on the substrate 100 may be smaller than the area of the orthogonal projection of the second portion of the semiconductor layer 1 on the substrate 100. The semiconductor layer 1 may be formed over the first electrode 4 and the second electrode 5, and may be connected to the first electrode 4 and the second electrode 5. In some embodiments, the first electrode 4 may be connected to one end of the semiconductor layer 1, and the second electrode 5 may be connected to the other end or the opposite end of the semiconductor layer 1, to reduce the straight distance between the first electrode 4 and the second electrode 5. The size of the semiconductor device may be further reduced. Further, in some embodiments, the orthogonal projection area of the doped layer 8, on the substrate 100, may be smaller than the orthogonal projection area of the trench bottom of the trench structure 10, on the substrate 100. Thus, the doped layer 8 may reduce the leakage current of the semiconductor device, and may have less impact on the length of the conductive channel.

Thus, in the disclosed semiconductor device, at a same orthogonal projection area, the length of the conductive channel, formed in the semiconductor layer with the disclosed structure, may be increased, and the leakage current may be reduced. Two TFTs may be electrically connected in series in operation, and less area is required to form the two TFTs with the disclosed semiconductor layer 1. The performance of the semiconductor device may be improved. The formed semiconductor device may have a reduced size. The performance of the semiconductor device may be ensured, and the semiconductor device may be suitable for products with high resolution.

Referring to FIG. 3, the semiconductor device provided by the present disclosure may include a substrate 100, a first electrode 40, a second electrode 50, an insulating layer 2, a semiconductor layer 1, an ohmic contact layer 7, a doped layer 8, a gate insulating layer 101, and two gate electrodes 3.

In one embodiment, the substrate 100 may be made of a suitable transparent material, e.g., glass.

The first electrode 40 and the second electrode 50 may be formed over the substrate 100. The first electrode 40 and the second electrode 50 may be formed from patterning a same source-drain conductive layer. In one embodiment, the source-drain conductive layer may be made of a suitable metal, e.g., copper.

The insulating layer 2 may be formed over the first electrode 40 and the second electrode 50. One end of the insulating layer 2 may be connected to the first electrode 40, and the other end or the opposite end of the insulating layer 2 may be connected to the second electrode 50. The insulating layer 2 may include top surfaces positioned away from the substrate 100 and being at least substantially parallel to the plane the substrate 100 is located in. The insulating layer 2 may also include side surfaces intersecting with the top surfaces.

The semiconductor layer 1 may be disposed over the insulating layer 2. The semiconductor layer 1 may include a first portion, a second portion, and a third portion. The first portion of the semiconductor layer 1 may cover the side surfaces of the insulating layer 2. The second portion of the semiconductor layer 1 may cover the top surfaces of the insulating layer 2 that are positioned away from the substrate 100. The third portion of the semiconductor layer 1 may include a first region and a second region. The first region may be positioned at one end of the semiconductor layer 1 and the second region may be positioned at the other end of the semiconductor layer 1. The first region and the second region may each electrically contact a different one of the source electrode 4 and the drain electrode 5. In one embodiment, the first region may be electrically connected to the first electrode 40 and the second region may be electrically connected to the second electrode 50.

The ohmic contact layer 7 may be positioned between the first electrode 40 and the semiconductor layer 1 and between the second electrode 50 and the semiconductor layer 1. In one embodiment, the ohmic contact layer 7 may be made of doped polysilicon.

The doped layer 8 may be disposed between the insulating layer 2 and the semiconductor layer 1. In one embodiment, the doped layer 8 may be made of doped polysilicon.

The gate insulating layer 101 may cover the semiconductor layer 1. In one embodiment, the gate insulating layer 101 may be made of silicon oxide and/or silicon nitride. The gate insulating layer 101 may have a single-layered structure or a combination of one or more silicon oxide layers and one or more silicon nitride layers.

The two gate electrodes 3 may be disposed over the gate insulating layer 101. The gate electrodes 3 may be formed through a same fabrication step.

It should be noted that, the specific structure of the disclosed semiconductor device should not be limited by the embodiments of the present disclosure. For example, the gate electrodes 3 may also be located below the first electrode 40 and the second electrode 50. The first electrode 40 and the second electrode 50 may be formed on the semiconductor layer 1. When the performance and functions of the semiconductor device are ensured, the specific structure of the semiconductor device may be adjusted according to different applications and/or designs.

Embodiments of the present disclosure further provide a method for fabricating the disclosed semiconductor device.

The method may include forming a semiconductor layer, a first electrode, a second electrode, and two gate electrodes on a substrate. The method may further include forming an insulating layer. The insulating layer may be disposed between the first electrode and the second electrode, between the gate electrodes and the first/second electrode, and between the first/second electrode and the semiconductor layer. One end of the semiconductor layer may electrically contact the first electrode, and the other end or the opposite end of the semiconductor layer may electrically contact the second electrode.

The fabrication process to form the semiconductor layer may include the following steps. First, the first portion of the semiconductor layer may be formed. The first portion may be located in a plane intersecting with the plane the substrate is located in. Further, the second portion of the semiconductor layer may be formed. The second portion may be located in a plane at least substantially parallel with the plane the substrate is located in. Further, the third portion of the semiconductor layer may be formed. The third portion may include the first region and the second region. The first region may electrically contact the first electrode, and the second region may electrically contact the second electrode.

In the semiconductor device fabricated through the described process, the semiconductor layer may be extended along the directions at least substantially parallel with and perpendicular to a top surface of the substrate. Thus, at a certain orthogonal projection area, the length of the semiconductor layer may be increased, and a conductive channel with an increased channel length may be provided. The performance of the semiconductor device may be improved. The semiconductor device may have a reduced size. The performance of the semiconductor device may be ensured, and the semiconductor device may be suitable for products having high resolution.

The fabrication method may further include forming a doped layer. The doped layer may have contact with the second portion of the semiconductor layer. The doped layer may be disposed between the first electrode and the second electrode. When the semiconductor device is turned on, the voltage difference between the first electrode and the doped layer may drive the carriers in the semiconductor layer, between the first electrode and the doped layer, to move. That is, the semiconductor device may function as two TFTs connected in series. Leakage current may be effectively reduced, and the semiconductor device may be more stable.

To form the semiconductor layer with the disclosed structure, the semiconductor layer may have a protruding shape, a trench shape, or a combination of a protruding shape and a trench shape. In various embodiments, the semiconductor layer 1 may have other suitable shapes, e.g., irregular shapes.

The fabrication process to form the semiconductor layer may be exemplified in connection with the description of the protruding structure and the trench structure.

In one embodiment, the fabrication process may include forming an insulating layer. The top surfaces of the insulating layer may be positioned away from the substrate and may be at least substantially parallel with the substrate. The insulating layer may include side surfaces intersecting with the top surfaces. The first portion of the semiconductor layer may be formed on the side surfaces of the insulating layer. The second portion of the semiconductor layer may be formed on the top surfaces of the insulating layer.

In the embodiment described above, the insulating layer may form a protruding structure such that the semiconductor layer, formed over the insulating layer, may be extended along directions at least substantially parallel with and perpendicular to the substrate. Thus, at a certain orthogonal projection area, the channel length of the semiconductor device may be increased. Further, the doped layer, formed between the semiconductor layer and the insulating layer, may connect the two TFTs in series when the semiconductor device is turned on, so that it may require less area to form two TFTs.

In another embodiment, the fabrication process may include forming a trench structure. The trench structure may be electrically insulating. The trench bottom may be at least substantially parallel with the plane the substrate is located in, and the trench sidewalls may be intersecting with the plane the substrate is located in. At least a portion of the first portion of the semiconductor layer is formed over the trench sidewalls of the trench structure. The second portion of the semiconductor layer may be formed over the trench bottom of the trench structure. Further, the doped layer, formed between the semiconductor layer and the transition layer, may connect the two TFTs in series when the semiconductor device is turned on, so that it may require less area to form two TFTs.

In the embodiment described above, the semiconductor layer, formed over the trench structure, may be extended along directions at least substantially parallel with and perpendicular to the substrate. Thus, at a same orthogonal projection area, the channel length formed in the disclosed semiconductor device may be increased compared to a conventional semiconductor device.

The fabrication process to form the disclosed semiconductor device is illustrated using the structure shown in FIG. 3 as an example. The process may be depicted in FIGS. 5-8. As shown in FIGS. 3, and 5-8. The fabrication process of the disclosed semiconductor device may include steps S1-S5.

Figure 5:
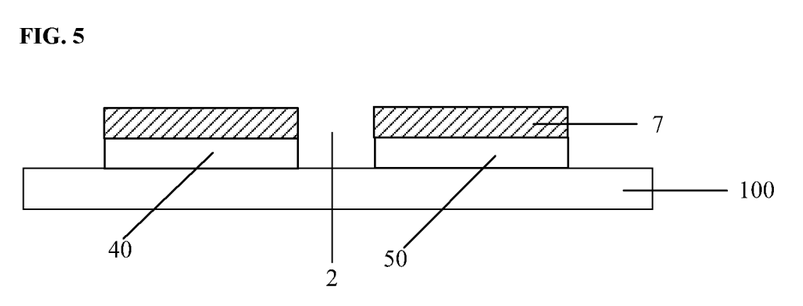
FIGS. 5-8 each illustrates a cross-section view of the exemplary semiconductor device illustrated in FIG. 3 at different stages of an exemplary fabrication process according to the disclosed embodiments of the present disclosure.

In step S1, as shown in FIG. 5, the first electrode 40, the second electrode 50, and the ohmic contact layer 7 may be formed. The first electrode 40 and the second electrode 50 may be formed through a same patterning process. The ohmic contact layer 7 may be located between the first electrode 40 and the subsequently-formed semiconductor layer 1. The ohmic contact layer 7 may also be located between the second electrode 50 and the subsequently-formed semiconductor layer 1.

Specifically, a source-drain conductive layer may be formed, and an ohmic contact film may be formed on the source-drain conductive layer. In one embodiment, the source-drain conductive layer may be made of a suitable metal, e.g., copper. In one embodiment, the ohmic contact film may be made of amorphous silicon.

Further, a photoresist layer may be formed over the ohmic contact film. A photolithography process, i.e., exposure and development, may be performed to form photoresist-retained regions and a photoresist-removed region. The photoresist-retained regions may correspond to the regions that the first electrode 40 and the second electrode 50 are located. The photoresist-removed region may correspond to other regions on the substrate 100.

Further, the portion of the source-drain conductive layer and the portion of the ohmic contact film corresponding to the photoresist-removed region may be removed. In one embodiment, a wet etching process may be performed to remove the portions of the source-drain conductive layer corresponding to the photoresist-removed region. In one embodiment, a dry etching process may be performed to remove the portions of the ohmic contact film corresponding to the photoresist-removed region.

Further, the photoresist layer may be removed or stripped off to form the first electrode 40 and the second electrode 50. The pattern of the subsequently-formed ohmic contact layer 7 may also be formed over the first electrode 40 and the second electrode 50.

When the subsequently-formed ohmic contact layer 7 is made of doped polysilicon, crystallization processes such as a metal-induced crystallization, laser annealing, and/or solid phase crystallization may be performed to convert the amorphous silicon into doped polysilicon. In some other embodiments, a suitable CVD process may be performed to deposit the ohmic contact film, made of polysilicon, on the source-drain conductive layer.

Further, a doping process may be performed on the pattern of the subsequently-formed ohmic contact layer 7, made of amorphous silicon layer and/or polysilicon, to form the ohmic contact layer 7. Specifically, an ion implantation process may be performed for doping ions. The ion implantation process may be a suitable ion implantation process such as an ion implantation with mass spectrometry, cloud-type ion implantation without mass spectrometry, plasma injection, and/or solid state diffusion implantation. In one embodiment, a cloud-type ion implantation may be performed. Based on different applications and/or designs, the gas used for the ion implantation may be a combination of a boron-containing gas and a phosphorous-contacting gas. For example, the boron-containing gas may be $B_2H_6/H_2$, and the phosphorous-containing gas may be $PH_3/H_2$. The implantation energy may be in the range of about 10 to about 200 KeV. In one embodiment, the implantation energy may be in the range of about 40 to about 100 KeV. The implantation concentration may be in the range of about $1\times10^{14}$ to about $1\times10^{20}$ atoms/cm$^3$. In one embodiment, the implantation concentration may be in the range of about $1\times10^{14}$ to about $1\times10^{18}$ atoms/cm$^3$.

When the ohmic contact layer 7 is made of doped amorphous silicon, the ohmic contact layer 7 may be deposited through a suitable process, e.g., PECVD and/or LPCVD. PH3 gas and/or B2H6 gas may be introduced into the deposition process to directly form doped amorphous silicon at a temperature below 600° C.

The source-drain conductive layer may be made of a suitable metal or alloy. For example, the source-drain conductive layer may be made of any one of Cu, Al, Ag, Mo, Cr, Nd, Ni, Mn, Ti, Ta, and W. The source-drain conductive layer may also be made of an alloy formed from two or more of the abovementioned metals. The source-drain conductive layer may have a single-layered structure or a multiple-layered structure. For example, the source-drain conductive layer may have a multiple-layered structure of Cu\Mo, Ti\Cu\Ti, Mo\Al\Mo, etc.

Figure 6:
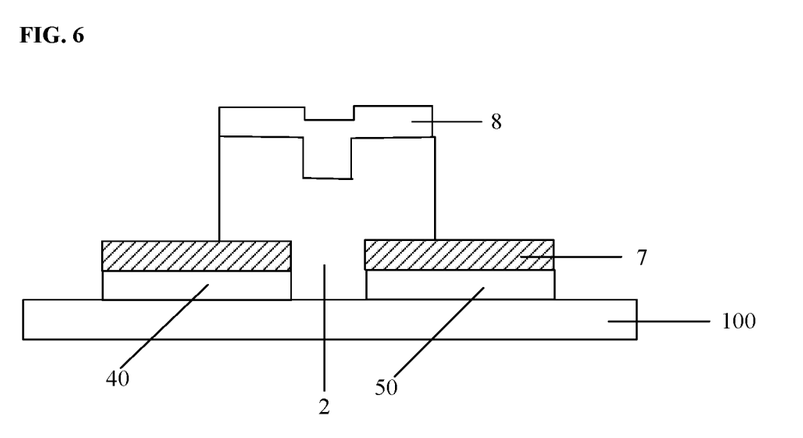

In step S2, as shown in FIG. 6, a patterning process may be performed to form the insulating layer 2 and the doped layer 8. The doped layer 8 may be positioned between the top surfaces of the insulating layer 2 and the semiconductor layer 1.

Specifically, an insulating film may be formed, and a conductive film may be formed over the insulating film.

A patterning process may be performed on the insulating film and the conductive film to form the pattern of the subsequently-formed insulating layer 2 and the pattern of the subsequently-formed doped layer 8. The top surfaces of the insulating layer 2 may be positioned away from the substrate 100 and may be at least substantially parallel with the plane the substrate 100 is located in. The insulating layer 2 may also include side surfaces intersecting with the top surfaces. The top surfaces of the insulating layer 2 and the doped layer 8 may have the same pattern.

The insulating layer 2 may be made of an inorganic material, e.g., silicon nitride, silicon oxide, and/or silicon oxynitride. The insulating layer 2 may have a single-layered structure or a multiple-layered structure. For example, the insulating layer 2 may include a single-layered silicon oxide, a single-layered silicon nitride, or a combination of at least one layer of silicon oxide and at least one layer of silicon nitride. The thickness of the insulating layer 2 may be in the range of about 2000 Å to about 8000 Å. In some other embodiments, the insulating layer 2 may be formed through a suitable deposition process such as PECVD, LPCVD, APCVD, and/ECR-CVD. The insulating layer 2 may also be made of a suitable organic material, e.g., organic resin, acrylic, and/or polyimide. The insulating layer 2 may have a single-layered structure or a multiple-layered structure. The thickness of the insulating layer 2 may be in the range of about 10000 Å to about 20000 Å. In some other embodiments, the insulating layer 2 may also include a combination of at least one layer of inorganic material and at least one layer of organic material. The thicknesses described above are merely suggested or exemplary thicknesses. The specific thickness of the insulating layer 2 may be determined according to different applications and/or designs and should not be limited by the embodiments of the present disclosure.

The doped layer 8 may be made of doped amorphous silicon and/or doped polysilicon. When the doped layer 8 is made of doped polysilicon, an amorphous silicon layer may be first deposited. The amorphous silicon may be crystalized to form a polysilicon layer. A crystallization processes such as a metal-induced crystallization, laser annealing, and/or solid phase crystallization may be performed to convert the amorphous silicon into doped polysilicon. In some other embodiments, a polysilicon layer may be directly deposited. The thickness of the polysilicon layer may be in the range of about 100 Å to about 3000 Å. In one embodiment, the thickness of the polysilicon layer may be in the range of about 500 Å to about 1000 Å. The polysilicon layer may be deposited through a suitable deposition process such as PECVD and LPCVD. The deposition temperature may be below 600° C. The doping process may be similar to the doping process for the ohmic contact layer 7 and is not repeated herein.

Figure 7:
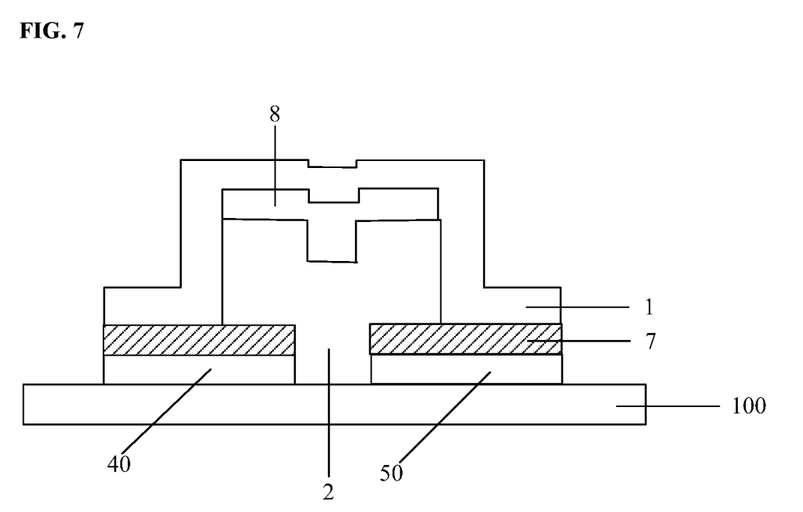

In step S3, as shown in FIG. 7, the semiconductor layer 1 may be formed. The semiconductor layer 1 may fully cover the insulating layer 2. The portions of the semiconductor layer 1, positioned at the two sides of the insulating layer 2, may contact the ohmic contact layer 7.

The semiconductor layer 1 may be made of a silicon-based semiconductor and/or a metal-oxide semiconductor. In one embodiment, the semiconductor layer 1 may be made of polysilicon. Because polysilicon has high carrier mobility (often a few hundred times higher than the carrier mobility of amorphous silicon), the size of the TFT may be sufficiently small, and the TFT may require less response time.

Figure 8:
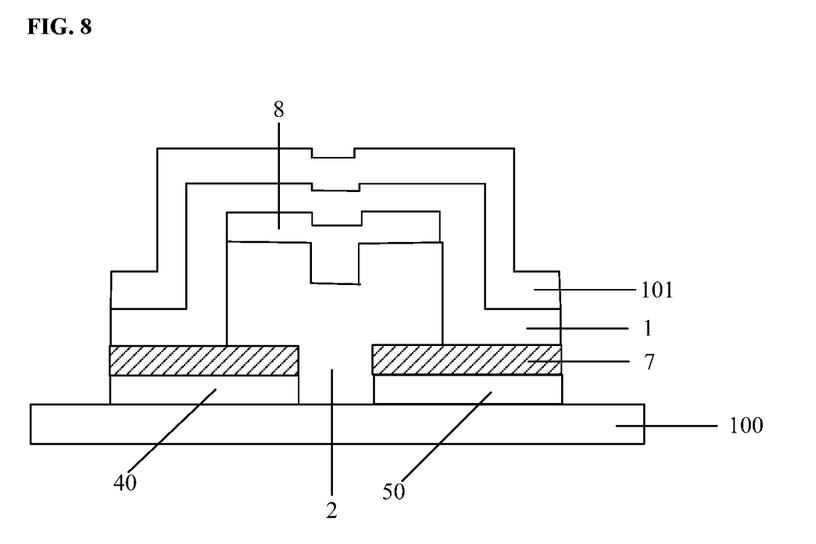

In step S4, as shown in FIG. 8, the gate insulating layer 101 may be formed.

The gate insulating layer 101 may be single-layered silicon oxide, single-layered silicon nitride, or a combination of at least one layer of silicon oxide and at least one layer of silicon nitride. The gate insulating layer 101 may be formed through a suitable deposition process, e.g., PECVD, LPCVD, APCVD, and/or ECR-CVD. The thickness of the gate insulating layer 101 may be in the range of about 500 Å to about 2000 Å. In one embodiment, the thickness of the gate insulating layer 101 may be in the range of about 600 Å to about 1500 Å. The specific thickness of the gate insulating layer 101 may be determined according to different applications and/or designs and should not be limited by the embodiments of the present disclosure.

In step S5, as shown in FIG. 3, two gate electrodes 3 may be formed. The two gate electrodes 3 may be formed through a same fabrication step.

The gate electrodes 3 may be made of any one of Cu, Al, Ag, Mo, Cr, Nd, Ni, Mn, Ti, Ta, and W. The source-drain conductive layer may also be made of an alloy formed from two or more of the abovementioned metals. The source-drain conductive layer may have a single-layered structure or a multiple-layered structure. For example, the source-drain conductive layer may have a multiple-layered structure of Cu\Mo, Ti\Cu\Ti, Mo\Al\Mo, etc. The thickness of a gate electrode 3 may be in the range of about 1000 Å to about 5000 Å. In one embodiment, the thickness of a gate electrode 3 may be in the range of about 1500 Å to about 4000 Å.

Accordingly, the fabrication of the semiconductor device may be completed.

In addition, in certain embodiments, processes such as dehydrogenation heat treatment and activation of dopants may be performed to facilitate certain properties of the semiconductor device. These additional steps do not affect the advantages provided by the disclosed technical solution nor do they narrow the scope of the present disclosure.

It should be noted that, steps S1-S5 are not limited to the order described above. The specific order of the steps may be flexibly adjusted in different applications and/or designs. For example, when the gate electrodes are located at the top of the semiconductor device, the first electrode and the second electrode may be formed first. Then, the insulating layer and the semiconductor layer may be formed. The gate insulating layer and the gate electrodes may be formed last. When the gate electrodes are located at the bottom of the semiconductor device, the gate electrodes and the gate insulating layer may be formed first. Then, the insulating layer and the semiconductor layer may be formed. The first electrode and the second electrode may be formed last. For semiconductor device having other structures, the specific fabrication steps may be determined based on the structures of the semiconductors. It is desired that the semiconductor layer is disposed over the insulating layer to increase the length of the semiconductor layer, and further increase the length of the conductive channel.

When the semiconductor layer 1 is disposed on the trench structure, fabrication steps to form the trench structure may be included into the steps described above. The semiconductor layer 1 may be formed to cover the doped layer 8 that is formed in the trench structure. The fabrication of semiconductor device with other structures may be referred to the fabrication process disclosed previously and is not repeated herein.

Embodiments of the present disclosure provide an array substrate and a display device containing the array substrate.

The array substrate may include the disclosed TFT and the disclosed semiconductor device. At a certain orthogonal projection area, the length of the semiconductor layer may be increased, and a conductive channel having an increased channel length may be provided. The performance of the TFT may be improved. The formed TFT may have a reduced size. The performance of the TFT may be ensured, and the TFT may be suitable for products having high resolution.

The display device may be a liquid crystal display device, an organic light-emitting diode device, and/or other suitable display devices applying TFTs to display images.

The display device may be a display substrate, a display panel, an electronic paper, a mobile phone, a tablet computer, a television, a monitor, a laptop computer, a digital photo frame, a navigation device, or any other suitable products or parts with display functions.

Compared to conventional technology, the technical solution provided by the present disclosure has a few advantages. In the disclosed technical solution, the semiconductor layer in the semiconductor device may include a first portion and a second portion. The first portion may be located in a plane that is intersecting or perpendicularly intersecting with the plane the substrate is located in. The second portion may be located in a plane that is at least substantially parallel with the plane the substrate is located in. Thus, the semiconductor layer may be extended along directions at least substantially parallel with and perpendicular to the substrate. With the same orthogonal projection area, the semiconductor layer may have an increased length, and the conductive channel formed in the semiconductor layer may have an increased channel length. The semiconductor layer may also connect two TFTs in series in operation and the disclosed TFT may have improved performance. Accordingly, TFTs with decreased size may be formed and the performance of the TFT may be ensured. The TFT may be suitable for products having high resolution. In addition, the masks used in the fabrication of the disclosed TFT and the disclosed semiconductor device, e.g., for photolithography processes and etching processes, may be the same as the existing fabrication process. No additional masks are needed for the fabrication process. Thus, the cost of fabrication process may be kept low.

The foregoing description of the embodiments of the disclosure has been presented for purposes of illustration and description. It is not intended to be exhaustive or to limit the disclosure to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the disclosure and its best mode practical application, thereby to enable persons skilled in the art to understand the disclosure for various embodiments and with various modifications as are suited to the particular use or implementation contemplated. It is intended that the scope of the disclosure be defined by the claims appended hereto and their equivalents in which all terms are meant in their broadest reasonable sense unless otherwise indicated.

Therefore, the term "the disclosure", "the present disclosure" or the like does not necessarily limit the claim scope to a specific embodiment, and the reference to exemplary embodiments of the disclosure does not imply a limitation on the disclosure, and no such limitation is to be inferred. The disclosure is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the disclosure. It should be appreciated that variations may be made in the embodiments described by persons skilled in the art without departing from the scope of the present disclosure as defined by the following claims. Moreover, no element and component in the present disclosure is intended to be dedicated to the public regardless of whether the element or component is explicitly recited in the following claims.

What is claimed is:

1. A semiconductor device, comprising:
a first electrode, an insulating layer, and a second electrode, over a substrate;
a conductive layer arranged on the insulating layer at a side away from the substrate;
a semiconductor layer: on the first electrode, on a first sidewall of the insulating layer, on the conductive layer, on a second sidewall of the insulating layer, and on the second electrode, wherein:
the semiconductor layer contacts the first sidewall of the insulating layer, the conductive layer, and the second sidewall of the insulating layer,
the second sidewall is located at an opposite side of the first sidewall, and
the conductive layer is patterned and located between the first sidewall and the second sidewall;
a first gate electrode over a portion of the semiconductor layer that is on the first sidewall of the insulating layer; and
a second gate electrode over a portion of the semiconductor layer that is on the second sidewall of the insulating layer.

2. The semiconductor device according to claim 1, wherein:
the semiconductor layer has a length connecting the first and second electrodes, and
the length of the semiconductor layer is greater than a straight distance between the first and second electrodes.

3. The semiconductor device according to claim 2, wherein:
the semiconductor layer has one or more of a protruding shape and a trench shape.

4. The semiconductor device according to claim 2, wherein:
the insulating layer is between the first and second electrodes, wherein the first and second electrodes are both on the substrate, and
the insulating layer is further extended on a surface portion of each of the first and second electrodes, and has the first sidewall on the first electrode, and the second sidewall on the second electrode.

5. The semiconductor device according to claim 4, wherein:
the conductive layer is on a surface of the insulating layer that has a trench formed into the insulating layer, and
a portion of the conductive layer is in the trench of the insulating layer.

6. The semiconductor device according to claim 4, wherein:
an orthogonal projection of the conductive layer on the substrate at least partially overlaps with orthogonal projections of the first electrode and the second electrode on the substrate.

7. The semiconductor device according to claim 2, wherein:
the insulating layer is on the substrate,
the first and second electrodes are on the insulating layer,
the insulating layer has a trench structure between the first and second electrodes,
the first sidewall of the insulating layer is a first trench sidewall in the insulating layer,
the second sidewall of the insulating layer is a second trench sidewall in the insulating layer, and
the conductive layer is in the insulating layer and under a bottom of the trench structure in the insulating layer.

8. The semiconductor device according to claim 7, wherein:
a portion of the semiconductor layer is in the trench of the insulating layer.

9. The semiconductor device according to claim 7, wherein:
an area of an orthogonal projection of the conductive layer on the substrate is smaller than an area of an orthogonal projection of a portion of the semiconductor layer that is substantially parallel with a surface plane of the substrate.

10. The semiconductor device according to claim 1, further including:
a gate insulating layer between the semiconductor layer and the gate electrodes.

11. The semiconductor device according to claim 1, wherein the conductive layer is made of one or more of doped amorphous silicon and doped polysilicon.

12. An array substrate, comprising one or more semiconductor devices each according to claim 1.

13. A display device, comprising the array substrate according to claim 12.

14. A method for forming a semiconductor device, comprising:
   forming a first electrode, an insulating layer, and a second electrode, over a substrate;
   forming a conductive layer arranged on the insulating layer at a side away from the substrate;
   forming a semiconductor layer: on the first electrode, on a first sidewall of the insulating layer, on the conductive layer, on a second sidewall of the insulating layer, and on the second electrode, wherein:
      the semiconductor layer contacts the first sidewall of the insulating layer, the conductive layer, and the second sidewall of the insulating layer,
      the second sidewall is located at an opposite side of the first sidewall, and
      the conductive layer is patterned and located between the first sidewall and the second sidewall;
   forming a first gate electrode over a portion of the semiconductor layer that is on the first sidewall of the insulating layer; and
   forming a second gate electrode over a portion of the semiconductor layer that is on the second sidewall of the insulating layer.

15. The method according to claim 14, wherein:
   the semiconductor layer has a length connecting the first and second electrodes, and
   the length of the semiconductor layer is greater than a straight distance between the first and second electrodes.

16. The method according to claim 15, wherein the semiconductor layer has one or more of a protruding shape and a trench shape.

17. The method according to claim 15, wherein:
   the insulating layer is formed between the first and second electrodes, wherein the first and second electrodes are both on the substrate, and
   the insulating layer is further extended on a surface portion of each of the first and second electrodes, and has the first sidewall on the first electrode, and the second sidewall on the second electrode.

18. The method according to claim 17, wherein:
   the conductive layer is on a surface of the insulating layer that has a trench formed into the insulating layer, and
   a portion of the conductive layer is disposed in the trench of the insulating layer.

19. The method according to claim 15, wherein:
   the insulating layer is on the substrate,
   the first and second electrodes are on the insulating layer,
   the insulating layer has a trench structure between the first and second electrodes,
   the first sidewall of the insulating layer is a first trench sidewall in the insulating layer,
   the second sidewall of the insulating layer is a second trench sidewall in the insulating layer, and
   the conductive layer is in the insulating layer and under a bottom of the trench structure in the insulating layer.

20. The method according to claim 19, wherein:
   a portion of the semiconductor layer is in the trench of the insulating layer.

* * * * *